US012755771B2

(12) United States Patent
Woo

(10) Patent No.: US 12,755,771 B2
(45) Date of Patent: Oct. 6, 2026

(54) MITIGATION OF REFRESH MANAGEMENT ROW HAMMER

(71) Applicant: Rambus Inc., San Jose, CA (US)

(72) Inventor: Steven C. Woo, Saratoga, CA (US)

(73) Assignee: Rambus, Inc., San Jose, CA (US)

( * ) Notice: Subject to any disclaimer, the term of this patent is extended or adjusted under 35 U.S.C. 154(b) by 191 days.

(21) Appl. No.: 18/886,696

(22) Filed: Sep. 16, 2024

(65) Prior Publication Data

US 2025/0104757 A1 Mar. 27, 2025

Related U.S. Application Data

(60) Provisional application No. 63/540,859, filed on Sep. 27, 2023.

(51) Int. Cl.
*G11C 11/406* (2006.01)

(52) U.S. Cl.
CPC .. *G11C 11/40615* (2013.01); *G11C 11/40622* (2013.01)

(58) Field of Classification Search
CPC ........ G11C 11/40615; G11C 11/40622; G11C 11/40603; G11C 11/40611; G11C 11/40618
USPC .......................................................... 365/222
See application file for complete search history.

(56) References Cited

U.S. PATENT DOCUMENTS

| | | | |
|---|---|---|---|
| 9,042,194 B2 | 5/2015 | Park et al. | |
| 9,767,050 B2 | 9/2017 | Doo et al. | |
| 9,767,883 B2 | 9/2017 | Doo et al. | |
| 9,875,785 B2 | 1/2018 | Jose et al. | |
| 10,636,476 B2 * | 4/2020 | Nale | G11C 11/4078 |
| 11,222,686 B1 * | 1/2022 | Noguchi | G11C 11/40603 |
| 2023/0039810 A1 | 2/2023 | Chen | |

OTHER PUBLICATIONS

Hassan, Hasan et al., "Uncovering In-DRAM RowHammer Protection Mechanisms: A New Methodology, Custom: RowHammer Patterns, and Implications", MICRO'21:54th Annual IEEE/ACM International Symposium on Microarchitecture (MICRO '21), Oct. 16-22, 2021, Virtual Event, Greece, ACM, New York NY https://doi.org/10.1145/3466752.3480110. 16 pages.

Luo, Haocong et al. "RowPress: Amplifying Read Disturbance in Modem DRAM Chips" arXiv:2306.17061v2 [cs.CR] Jul. 7, 2023. 27 pages.

Luo, Haocong et al., "RowPress; Amplifying Read Disturbance In Modern DRAM Chips" ISCA '23, Jun. 17-21, 2023, Orlando, FL, https://doi.org/10.1145/3579371.3589063. 18 pages.

* cited by examiner

*Primary Examiner* — Huan Hoang

(74) *Attorney, Agent, or Firm* — The Neudeck Law Firm, LLC

(57) ABSTRACT

A controller periodically (based on, for example, clock time or number of intervening activate commands) issues mitigation operation commands. For each (or some) mitigation operation command issued, the controller probabilistically determines whether to increase or decrease the configured number of rows in the vicinity of the suspected aggressor row that are to be refreshed by the next mitigation operation command it issues.

20 Claims, 8 Drawing Sheets

MITIGATION OF REFRESH MANAGEMENT ROW HAMMER

DETAILED DESCRIPTION OF THE EMBODIMENTS

Figure 1:
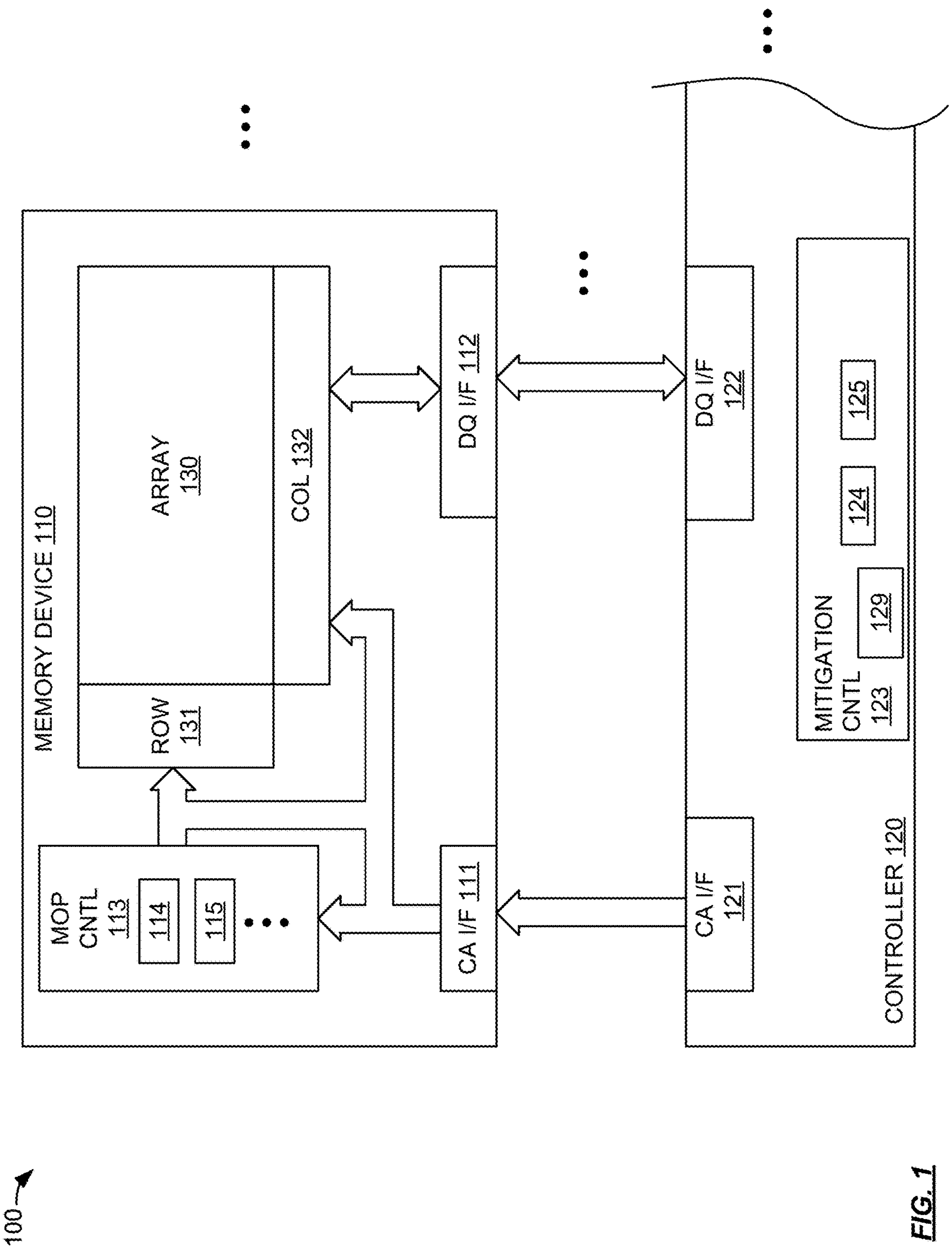
FIG. 1 is a block diagram illustrating a memory system.

Repeated row activations and/or refreshes of the same row (a.k.a., "aggressor row") in a dynamic random access memory (DRAM) device (whether malicious or coincidental) can cause cells of rows (a.k.a., "victim rows") in the neighborhood of the aggressor row to lose a stored value. This effect on DRAM storage reliability has been termed "row hammer". Row hammer, when applied to multiple, parallel, DRAM device access that may occur with memory modules, can cause multiple errors across multiple DRAM devices on the module that are possibly uncorrectable and/or undetectable.

In an embodiment, mitigation operation (MOP) commands are issued to a memory device in order to cause the refresh of rows within a specified vicinity of a suspected aggressor row. The mitigation operations (e.g., directed refresh management commands—DRFM commands) are each associated with respective row addresses that indicate the suspected aggressor row. The memory device may also be configured with the number of rows in the vicinity of the suspected aggressor row that are to always be refreshed in response to mitigation operation commands in order to mitigate the likelihood of data being corrupted by "row hammer". In some embodiments, the memory device may, periodically, or probabilistically, elect to refresh an additional row out from the suspected aggressor row than the configured number of rows. Unfortunately, in some circumstances, refreshing these additional rows may occur often enough to cause row hammer corruption of data in the neighboring rows to the additional rows.

In an embodiment, a controller periodically (based on, for example, clock time or number of intervening activate commands) issues mitigation operation commands. For each (or some) mitigation operation command issued, the controller probabilistically determines whether to increase or decrease the configured number of rows in the vicinity of the suspected aggressor row that are to be refreshed by the next mitigation operation command it issues.

For example, if the memory device is currently configured to always refresh at least one level of victim rows, and only occasionally refresh two levels of victim rows (i.e., the "victim" rows to always be refreshed are the two immediate neighbor rows, and the "additional" rows to be occasionally refreshed are the next rows out from the immediate neighbor rows) the controller probabilistically decides whether to reconfigure, for at least the next mitigation operation command it issues, the memory device to always refresh two levels of victim rows and occasionally refresh three levels of victim rows (i.e., always refresh the rows that are the immediate neighbor rows, and the next rows out from the immediate neighbor rows, and only occasionally refresh the rows that are three rows out from the victim row). In this manner, the probability of row hammer corruption of the third level of victim rows (i.e., the rows that are three rows out from the victim row) being caused by the "occasional" mitigation operation refreshes to the second level victim rows is reduced.

The descriptions and embodiments disclosed herein may be made with references to DRAM devices and DRAM memory arrays. This, however, should be understood to be a first example where, due at least to the widespread adoption of DRAM technology, "row-hammer" has been observed and studied. It should be understood that other memory technologies that may be susceptible to "row-hammer" and therefore may also benefit from the methods and/or apparatus described herein. These memory technologies include, but are not limited to static random access memory (SRAM), non-volatile memory (such as flash), conductive bridging random access memory (CBRAM—a.k.a., programmable metallization cell—PMC), resistive random access memory (a.k.a., RRAM or ReRAM), magnetoresistive random-access memory (MRAM), Spin-Torque Transfer (STT-MRAM), phase change memory (PCM), and the like, and/or combinations thereof. Accordingly, it should be understood that in the disclosures and/or descriptions given herein, these aforementioned technologies may be substituted for, included with, and/or encompassed within, the references to DRAM, DRAM devices, and/or DRAM arrays made herein.

FIG. 1 is a block diagram illustrating a memory system. In FIG. 1, memory system 100 comprises memory device 110 and memory controller 120. Memory device 110 includes command/address (CA) interface 111, data (DQ) interface 112, mitigation operation (MOP) control 113, memory array 130, row circuitry 131, and column circuitry 132. Mitigation operation control 113 includes mitigation operation configuration register 114 and selected address register 115. Controller 120 includes CA interface 121, DQ interface 122, and mitigation control circuitry 123. Mitigation control circuitry 123 includes configuration information 129, random number generator 124, and selected address register 125.

Controller 120 and memory device 110 may be integrated circuit type devices, such as are commonly referred to as "chips". A memory controller, such as controller 120, manages the flow of data going to and from memory devices and/or memory modules. Memory device 110 may be a standalone device, or may be a component of a memory module such as a DIMM module used in servers. Memory device 110 may be a device that adheres to, or is compatible with, a dynamic random access memory (DRAM) specification. A memory controller can be a separate, standalone chip, or integrated into another chip. For example, a memory controller 120 may be included on a single die with a microprocessor, included as a chip co-packaged with one or more microprocessor chips, included as part of a more complex integrated circuit system such as a block of a system on a chip (SOC), or be remotely coupled to one or more microprocessors via a fabric interconnect or other type of interconnect.

CA interface 121 of controller 120 is operatively coupled to CA interface 111 of memory device 110. CA interface 121 is operatively coupled to CA interface 111 to communicate commands and addresses (e.g., row and column addresses) from controller 120 to memory device 110. In an embodiment, the commands communicated from memory controller 120 to memory device 110 include activate (ACT) commands with an associated external row address, mitigation operation (MOP) commands associated with an external row address (a.k.a., "suspected aggressor row"), and configuration commands (e.g., mode register set—MRS—commands).

Configuration commands may be used by controller 120 to set an objective indicator (a.k.a., "victim level" and/or "victim level indicator") in mitigation operation mode register 114 of memory device 110. The objective indicator indicates, to memory device 110, a minimum number of neighboring rows from the suspected aggressor row that are to be refreshed. For example, an objective indicator associated with a minimum of one row indicates that, at a minimum, the immediate neighbor rows (a.k.a., victim level 1 rows) to the suspected aggressor row are to be refreshed. An objective indicator associated with a minimum of two rows indicates that, at a minimum, the victim level 1 rows and the immediate next rows to the victim level 1 rows farther away from the suspected aggressor row (i.e., that have the victim level 1 rows intervening between them and the suspected aggressor row—a.k.a., victim level 2 rows) are to be refreshed. An objective indicator associated with a minimum of three rows indicates that, at a minimum, the victim level 1 rows, the victim level 2 rows, and the immediate next rows to the victim level 2 rows farther away from the suspected aggressor row (i.e., that have the victim level 1 rows and the victim level 2 rows intervening between them and the suspected aggressor row—a.k.a., victim level 3 rows) are to be refreshed. Note that most rows (i.e., those not near the top or bottom of memory array 130) will have two victim level 1 rows (one above and one below), two victim level 2 rows, (one above and one below), two victim level 3 rows (one above and one below), and so on.

Figure 2:
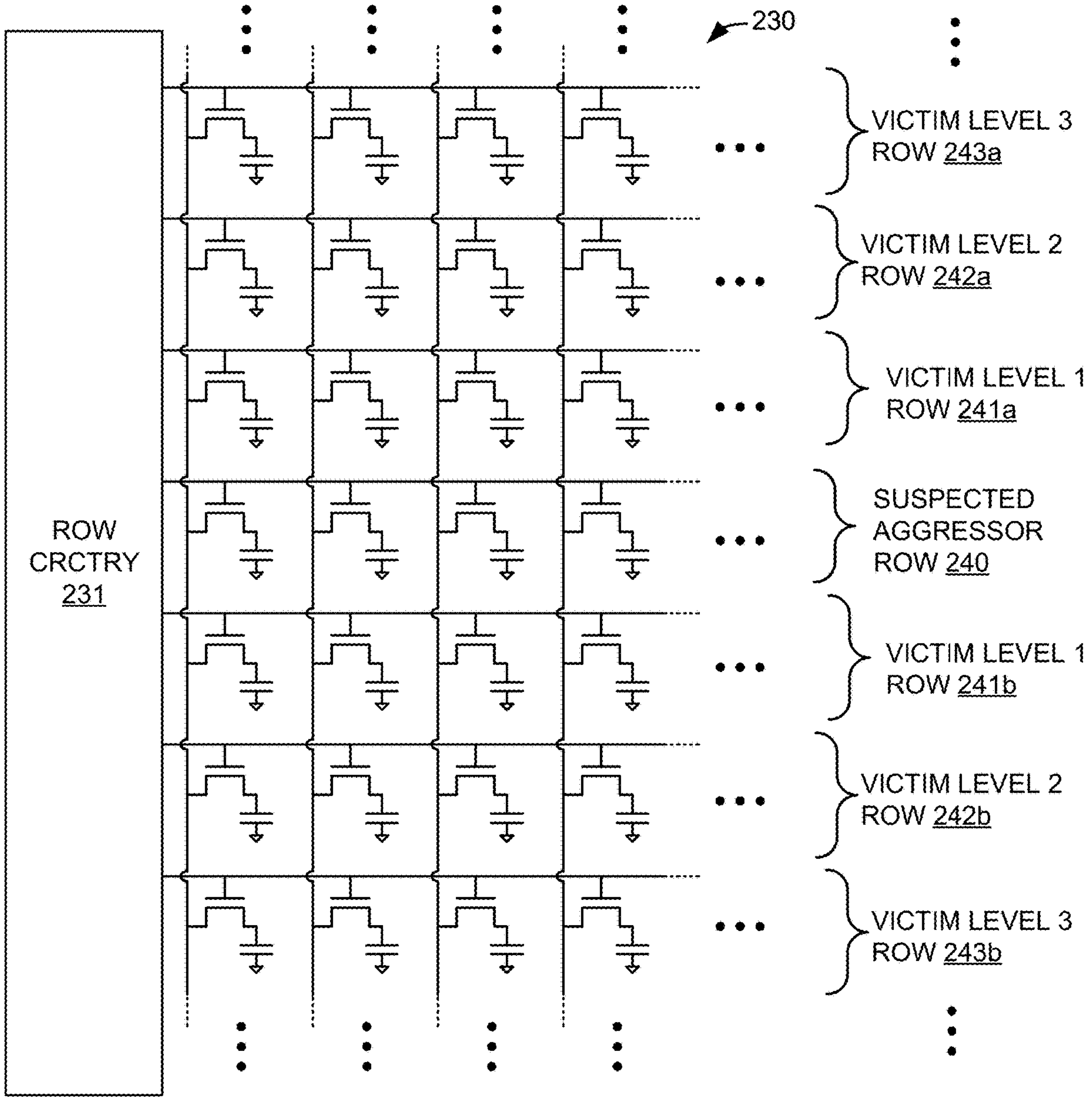
FIG. 2 is a diagram illustrating the relationship between a suspected aggressor row and victim rows.

FIG. 2 is a diagram illustrating the relationship between an aggressor row (or suspected aggressor row) and victim row levels. In FIG. 2, row circuitry 231 (e.g., row circuitry 131) and a partial DRAM memory array 230 (e.g., memory array 130) are illustrated. The rows of memory array 230 are illustrated running from left to right with rows being adjacent to each other in the up and down directions. A suspected aggressor row 240 is illustrated near the middle of array. Immediately adjacent to suspected aggressor row 240 (i.e., without any intervening rows) are victim level 1 rows 241*a*-241*b* (one above and one below, respectively).

Immediately above victim level 1 row 241*a* is victim level 2 row 242*a*. Likewise, immediately below victim level 1 row 241*b* is victim level 2 row 242*b*. Thus, it should be noted that each victim level 2 row 242*a*-242*b* has one intervening row (level 1 rows 241*a*-241*b*, respectively) between themselves and suspected aggressor row 240. Immediately above victim level 2 row 242*a* is victim level 3 row 243*a*. Likewise, immediately below victim level 2 row 242*b* is victim level 3 row 243*b*. Thus, it should be noted that each victim level 3 row 243*a*-243*b* have two intervening rows between themselves and suspected aggressor row 240, and so on for additional victim levels (e.g., level 4, level 5, etc.).

Returning now to FIG. 1, memory controller 120 is operatively coupled to memory device 110 via DQ interface 122 and DQ interface 112. Memory controller 120 and memory device 110 are operatively coupled via DQ interface 122 and DQ interface 112 to bidirectionally communicate data. Memory device 110 may store (e.g., in memory array 130) and retrieve (e.g., from memory array 130) data communicated via DQ interface 122 and DQ interface 112.

CA interface 111 of memory device 110 is operatively coupled to memory array 130. Row addresses received via CA interface 111 (a.k.a., external row addresses) in association with activate (ACT) commands are operatively coupled to memory array 130 via row circuitry 131 (e.g., row address decoders, buffers, etc.) Row addresses received via CA interface 111 (a.k.a., external row addresses) may be selected (e.g., by an indicator or bit in a command) to be associated with mitigation operation (MOP) commands. Row addresses selected to be associated with one or more MOP commands may be stored in selected address register 115. A row address stored in selected address register 115 is the "suspected aggressor row" for the next MOP command received by memory device 110.

Mitigation operation control uses the suspected aggressor row address in selected address register 115 and the configured objective indicator in mitigation operation configuration register 114 to determine which (e.g., how many) rows adjacent to, and/or in the vicinity of, the row addressed by suspected aggressor row address in selected address register 115 are to be refreshed in response to the MOP command. The row addresses to be refreshed are operatively coupled to row circuitry 131 (e.g., row address decoders, buffers, etc.) Column addresses received via CA interface 111 are operatively coupled to memory array 130 via column circuitry 132 (e.g., column address decoders, buffers, etc.).

Mitigation control circuitry 123 of memory controller 120 determines when and how often (e.g., number of intervening ACT commands between MOP commands) to transmit MOP commands to memory device 110 via CA interface 121 and CA interface 111. For example, based on configuration information 129 (e.g., information received from memory device 110, mode, operating mode, programmed register value, programmed fuses, etc.), mitigation control circuitry 123 issues mitigation operation commands to memory device 110. In an embodiment, memory controller 120 transmits MOP commands to memory device 110 using a fixed (e.g., configured) number of activate commands between consecutive pairs of MOP commands. In another embodiment, memory controller 120 transmits MOP commands to memory device 110 using varying numbers of activate commands between consecutive pairs of MOP commands.

In an embodiment, memory device 110 will periodically, or probabilistically, elect to refresh an additional victim level out from the suspected aggressor row than the configured number of rows that are always refreshed in response to a MOP command. For example, if memory device 110 is configured to, at a minimum, refresh victim level 1 rows and victim level 2 rows, memory device 110 will, in response to a MOP command, periodically (e.g., every, or roughly every, $N^{th}$ MOP command), or probabilistically (e.g., with a probability of 1/N), refresh the victim level 3 rows in addition to refreshing the configured victim level 1 rows and victim level 2 rows. In some embodiments, a configuration that specifies, in response to a MOP command, how many victim levels are to at a minimum be refreshed, and/or how many victim levels are to be periodically or probabilistically refreshed, may be known as Bounded Refresh Configuration (BRC).

In an embodiment, controller 120 may, based on being in a mode, probabilistically switch the minimum (i.e., configured) number of rows that memory device 110 is to refresh in response to MOP commands. For example, if memory device 110 is currently configured to, at a minimum, refresh victim level 1 rows and victim level 2 rows, controller 120 may, before sending a given MOP command, determine whether to reconfigure memory device 110 to refresh a different minimum number of victim rows. Thus, for example, based on a randomized selection technique having a probability (e.g., 1/N or (N−1)/N—where N is, for example, a positive integer greater than 1) of electing to change the configuration of memory device 110, controller 120 may determine whether or not to change the mode of memory device 110.

In other words, if the randomized selection technique meets a first threshold condition (e.g., random number generator 124 has an output that ranges from 1 to N, and the probability of changing the mode to increase the number of victim levels refreshed is configured to be 1/N, and random number generator 124 outputs the number 1), controller 120 will reconfigure memory device 110 to increase the minimum number of victim rows to be refreshed by the next MOP command (e.g., to refresh a minimum of victim levels 1 through 3 from refreshing a minimum of victim level 1 and 2). Similarly, if the randomized selection technique meets a second threshold condition (e.g., random number generator 124 has an output that ranges from 1 to N, and the probability of changing the mode to decrease the number of victim levels refreshed is configured to be (N−1)/N, and random number generator 124 outputs a number in the range of 2 to N), controller 120 will reconfigure memory device 110 to decrease the minimum number of victim rows to be refreshed by the next MOP command (e.g., to refresh a minimum of victim levels 1 and 2 from refreshing a minimum of victim levels 1-3).

In an embodiment, controller 120 determines whether to increase/decrease the minimum number of victim levels that are to be refreshed before each MOP command is transmitted. In an embodiment, the probabilities of increasing/decreasing the minimum number of victim levels that are refreshed is based on a refresh interval associated with memory device 110. In an embodiment, the probabilities of increasing/decreasing the minimum number of victim levels that are refreshed is based on a minimum number (or average number) of row hammers to a row of memory device 110 that can cause corruption of data. In an embodiment, the probabilities of increasing/decreasing the minimum number of victim levels that are refreshed is based on a duration (clock time) that a row in memory device 110 has or had spent in an open state.

In another embodiment, the probabilities of increasing/decreasing the minimum number of victim levels that are refreshed is based on an activate (ACT) command count threshold obtained from memory device 110 (e.g., from configuration information). For example, memory device 110 may indicate to controller 120 that a mitigation operation command should be issued to memory device 110 every N number of ACT commands (or an average of every N ACT commands. Thus, in this example, controller 120 may base the probability of increasing and decreasing the minimum number of victim levels to be refreshed by before each MOP commands on the number N (e.g., 1/N to increase number of victim levels from a previous, or configured, number of levels and (N−1)/N to decrease the number of victim levels back to a previous, or configured, number of levels).

Figure 3:
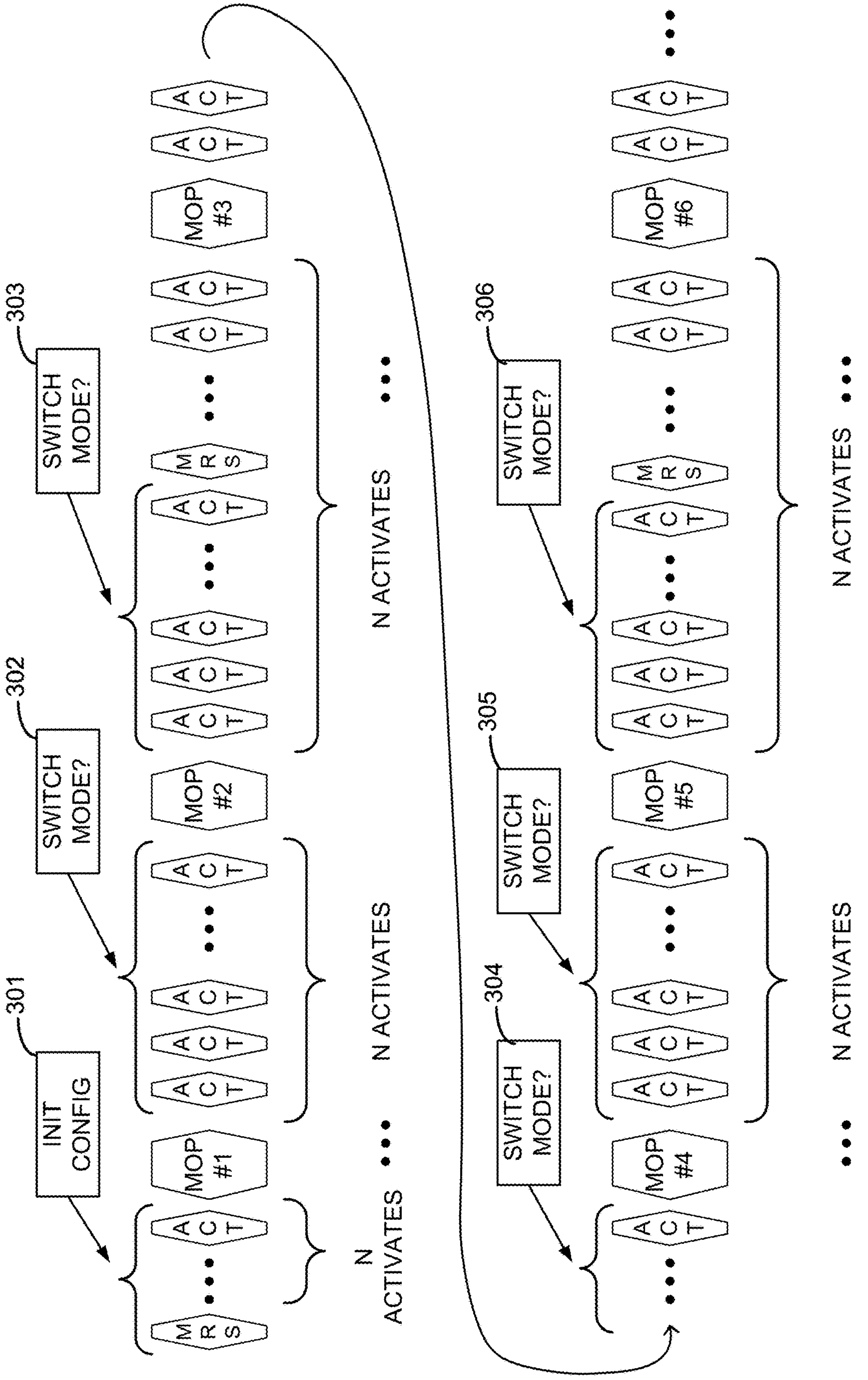
FIG. 3 is a flowchart illustrating an example sequence to mitigate refresh management row hammer.

FIG. 3 is a flowchart illustrating an example command sequence to mitigate refresh management row hammer. In FIG. 3, controller 120 configures memory device 110 with an initial configuration that determines the minimum number of rows that are to be refreshed with each mitigation operation command. After configuration controller 120 issues N activates and other commands not shown in FIG. 3 (301). Controller 120 then issues a first MOP command (MOP #1) followed by a second N number of activate commands. During the interval that controller 120 is issuing the second N number of activate commands (and other commands not shown in FIG. 3), controller 120 probabilistically determines not to reconfigure memory device 110 to increase the minimum number of rows to be refreshed by the next MOP command (302). Controller 120 then issues a second MOP command (MOP #2) followed by a third N number of activate commands (and other commands not shown in FIG. 3).

During the interval that controller 120 is issuing the third N number of activate commands (and other commands not shown in FIG. 3), controller 120 probabilistically determines to reconfigure memory device 110 to increase the minimum number of rows to be refreshed by the next MOP command (303). Thus, during the interval that controller 120 is issuing the third N number of activate commands, controller 120 also issues a mode register set (MRS) command to reconfigure memory device 110 to increase the minimum number of rows to be refreshed by the next MOP command. Controller 120 then issues a third MOP command (MOP #3) followed by a fourth N number of activate commands (and other commands not shown in FIG. 3).

During the interval that controller 120 is issuing the fourth N number of activate commands (and other commands not shown in FIG. 3), controller 120 probabilistically determines not to reconfigure memory device 110 to decrease the minimum number of rows to be refreshed by the next MOP command (304). Controller 120 then issues a fourth MOP command (MOP #4) followed by a firfth N number of activate commands (and other commands not shown in FIG. 3). During the interval that controller 120 is issuing the fifth N number of activate commands (and other commands not shown in FIG. 3), controller 120 probabilistically determines not to reconfigure memory device 110 to decrease the minimum number of rows to be refreshed by the next MOP command (305). Controller 120 then issues a fifth MOP command (MOP #5) followed by a sixth N number of activate commands (and other commands not shown in FIG. 3).

During the interval that controller 120 is issuing the sixth N number of activate commands (and other commands not shown in FIG. 3), controller 120 probabilistically determines to reconfigure memory device 110 to decrease the minimum number of rows to be refreshed by the next MOP command (306). Thus, during the interval that controller 120 is issuing the sixth N number of activate commands, controller 120 also issues a mode register set (MRS) command to reconfigure memory device 110 to decrease the minimum number of rows to be refreshed by the next MOP command back to its initial value.

Figure 4:
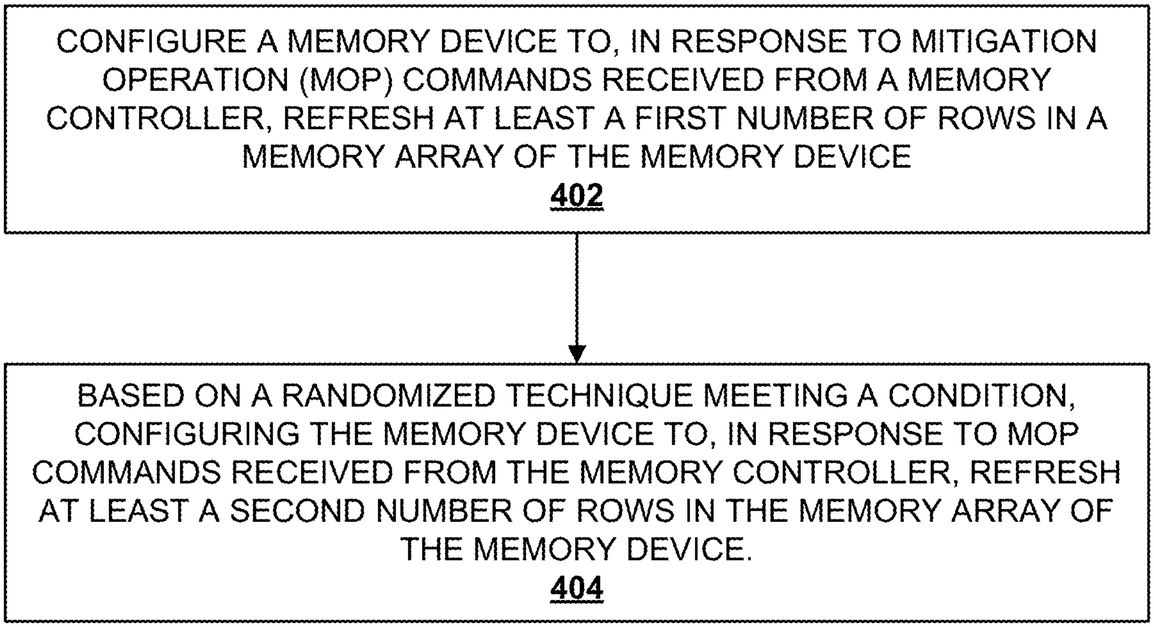
FIG. 4 is a flowchart illustrating a method of mitigating refresh management row hammer.

FIG. 4 is a flowchart illustrating a method of mitigating refresh management row hammer. One or more steps illustrated in FIG. 4 may be performed by, for example, system 100, and/or its components. A memory device is configured to, in response to mitigation operation commands received from a memory controller, refresh at least a first number of rows in a memory array of the memory device (402). For example, memory device 110 may be configured, by memory controller 120, to refresh a first minimum number (e.g., 2) of levels of victim rows.

Based on a randomized technique meeting a condition, the memory device is configured to, in response to mitigation operation commands received from the memory controller, refresh at least a second number of rows in the memory array of the memory device (404). For example, based on a random number value from random number generator 124 meeting a condition (e.g., equal to N, equal to 1, within the range of 2 to N, etc.) controller 120 may transmit one of more mode setting commands (e.g., MRS) to reconfigure memory device 110 to refresh a different minimum number (e.g., 3) of levels of victim rows. In another embodiment, rather than a randomized or pseudo-random technique, an algorithmic technique (e.g., every $M^{th}$ set of N activates, every P number of seconds or milliseconds, etc.) may meet a condition to trigger the reconfiguration of the number of rows in the memory array that are to be refreshed in response to mitigation operation commands.

Figure 5:
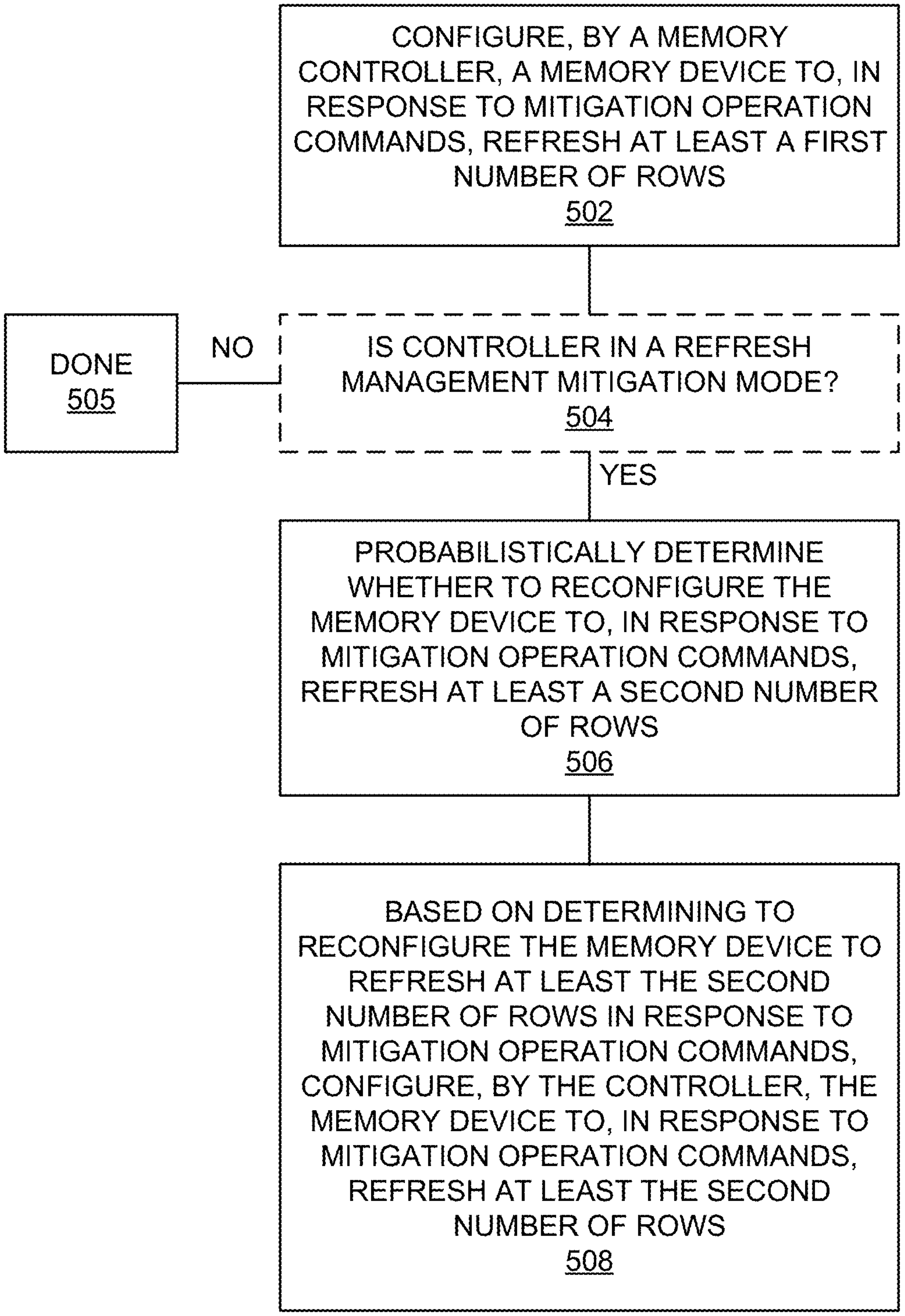
FIG. 5 is a flowchart illustrating a method of reconfiguring a memory device to mitigate refresh management row hammer.

FIG. 5 is a flowchart illustrating a method of reconfiguring a memory device to mitigate refresh management row hammer. One or more steps illustrated in FIG. 5 may be performed by, for example, system 100, and/or its components. By a memory controller, a memory device is configured to, in response to mitigation operation commands, refresh at least a first number of rows (502). For example, memory device 110 may be configured, by memory controller 120, to, in response to mitigation operation commands, refresh a first minimum number (e.g., 2) of levels of victim rows around a suspected aggressor row.

If the controller is in not in a refresh management mitigation mode, flow proceeds to box 505. In box 505, the flow ends. For example, controller 120 may determine whether it is in a mode where it should determine whether to occasionally reconfigure memory device 110 to change the number of levels of victim rows that are refreshed in response to mitigation operation commands. If the controller is in in a refresh management mitigation mode, flow proceeds to box 506 (504). It is probabilistically determined whether to reconfigure the memory device to, in response to mitigation operation commands, refresh at least a second number of rows (506). For example, based on a random number value from random number generator 124 meeting a condition (e.g., equal to N, equal to 1, within the range of 2 to N, etc.) controller 120 may determine whether to reconfigure memory device 110 to refresh a different minimum number (e.g., 3) of levels of victim rows. In another embodiment, rather than being probabilistically based on a random or pseudo-random number, an algorithmic technique (e.g., every $M^{th}$ set of N activates, every P number of seconds or milliseconds, etc.) may determine whether to reconfigure the number of rows in the memory array that are to be refreshed in response to mitigation operation commands.

Based on determining to reconfigure the memory device to refresh at least the second number of rows in response to mitigation operation commands, the controller configures the memory device to, in response to mitigation operation commands, refresh at least the second number of rows (508). For example, based on controller 120 determining to reconfigure memory device 110 to refresh a different minimum number (e.g., 3) of levels of victim rows, controller 120 may transmit one of more mode setting commands (e.g., MRS) to reconfigure memory device 110 to refresh a different minimum number (e.g., 3) of levels of victim rows.

Figure 6:
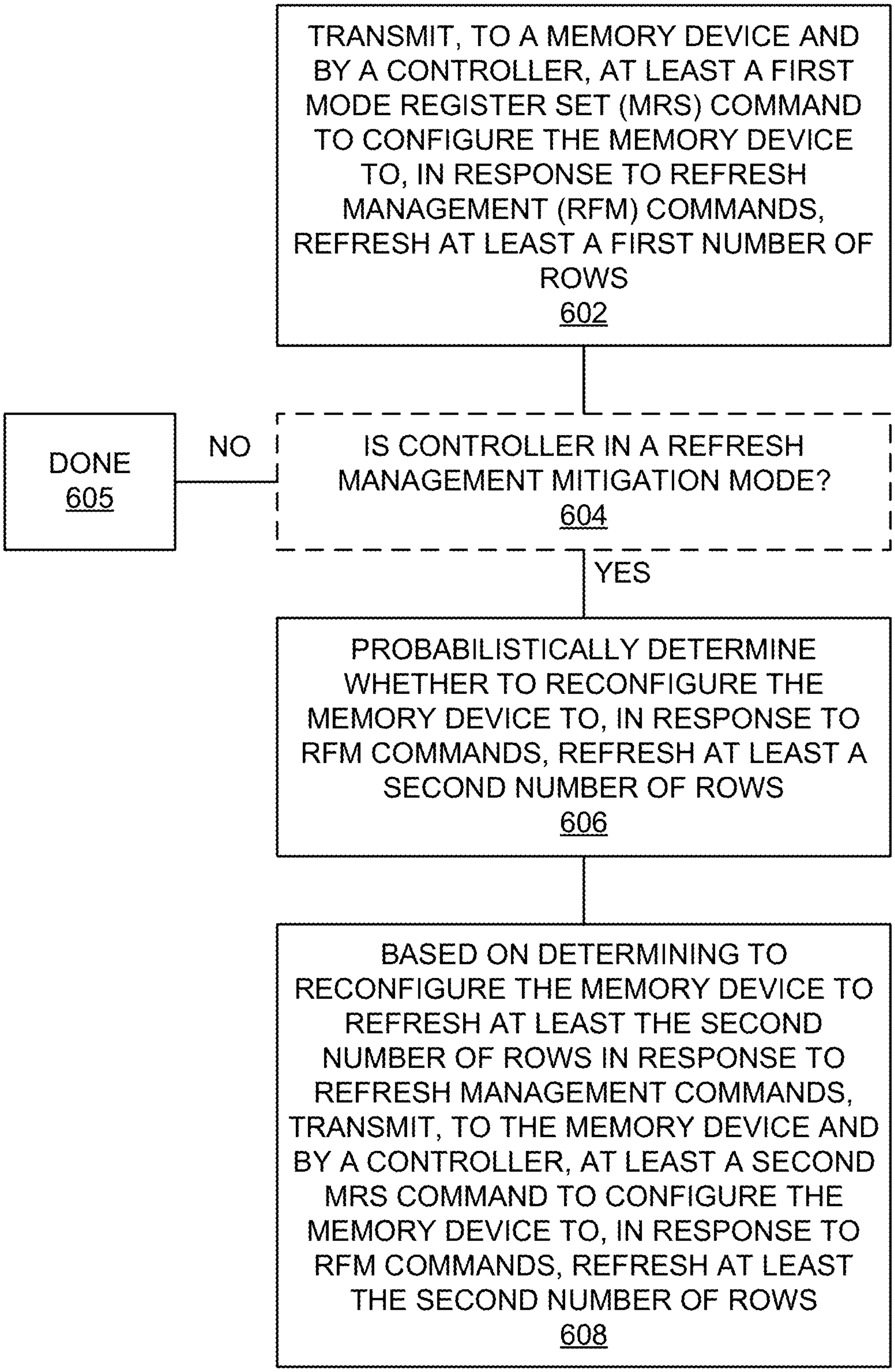
FIG. 6 is a flowchart illustrating a method of setting modes in a memory device to mitigate refresh management row hammer.

FIG. 6 is a flowchart illustrating a method of setting modes in a memory device to mitigate refresh management row hammer. One or more steps illustrated in FIG. 6 may be performed by, for example, system 100, and/or its components. To a memory device and by a memory controller, at least a first mode register set (MRS) command is transmitted to configure the memory device to, in response to refresh management commands, refresh at least a first number of rows (502). For example, controller 120 may transmit, to memory device 110 a first MRS command to configure memory device 110 to, in response to refresh management commands, refresh a first minimum number (e.g., 2) of levels of victim rows around a suspected aggressor row.

If the controller is in not in a refresh management mitigation mode, flow proceeds to box 605. In box 605, the flow ends. If the controller is in in a refresh management mitigation mode, flow proceeds to box 606 (604). For example, controller 120 may determine whether it is in a mode where it should determine whether to occasionally reconfigure memory device 110 to change the number of levels of victim rows that are refreshed in response to refresh management commands. It is probabilistically determined whether to reconfigure the memory device to, in response to refresh management commands, refresh at least a second number of rows (606). For example, based on a random number value from random number generator 124 meeting a condition (e.g., equal to N, equal to 1, within the range of 2 to N, etc.) controller 120 may determine whether to reconfigure memory device 110 to refresh a different minimum number (e.g., 3) of levels of victim rows. In another embodiment, rather than being probabilistically based on a random or pseudo-random number, an algorithmic technique (e.g., every $M^{th}$ set of N activates, every P number of seconds or milliseconds, etc.) may determine whether to reconfigure the number of rows in the memory array that are to be refreshed in response to mitigation operation commands.

Based on determining to reconfigure the memory device to refresh at least the second number of rows in response to refresh management commands, at least a second MRS command is transmitted, by the controller and to the memory device, to configure the memory device to, in response to mitigation operation commands, refresh at least the second number of rows (608). For example, based on controller 120 determining to reconfigure memory device 110 to refresh a different minimum number (e.g., 3) of levels of victim rows, controller 120 may transmit a second MRS to reconfigure memory device 110 to refresh a different minimum number (e.g., 3) of levels of victim rows.

Figure 7:
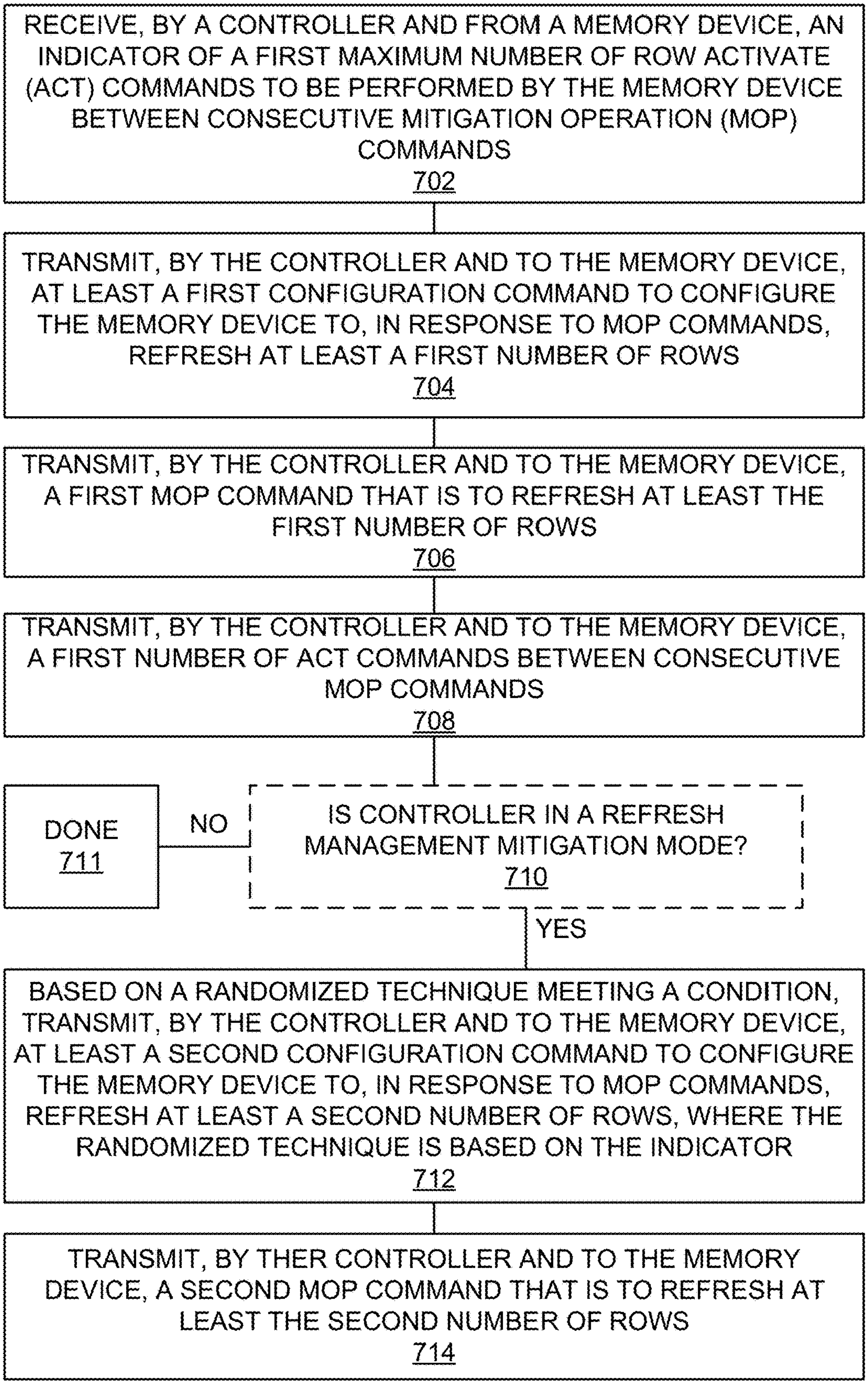
FIG. 7 is a flowchart illustrating a method of mitigating refresh management row hammer.

FIG. 7 is a flowchart illustrating a method of mitigating refresh management row hammer. One or more steps illustrated in FIG. 7 may be performed by, for example, system 100, and/or its components. By a controller and from a memory device, an indicator of a first maximum number of row activate (ACT) command to be performed by the memory device between consecutive mitigation operation (MOP) commands is received (702). For example, controller 120 may receive, from memory device 110, configuration information that indicates to controller 120 a maximum number of ACT commands that should not be exceeded between consecutive MOP commands. In another example, controller 120 may receive configuration information that indicates to controller 120 a maximum number of ACT commands that should not be exceeded between consecutive MOP commands from another device, such as a serial presence detect device on a memory module, and/or the host system and/or software. (702).

By the controller and to the memory device, at least a first configuration command is transmitted to configure the memory device to, in response to MOP commands, refresh at least a first number of rows (704). For example, controller 120 may transmit, to memory device 110, at least a first MRS command to configure memory device 110 to, in response to mitigation operation commands, refresh a first minimum number (e.g., 2) of levels of victim rows around a suspected aggressor row. By the controller and to the memory device, a first MOP command to refresh at least the first number of rows is transmitted (706). For example, controller 120 may transmit, to memory device 110, a first MOP command while memory device 110 is configured to refresh at least the first number of levels of victim rows (e.g., 2).

By the controller and to the memory device, a first number of ACT commands are transmitted between consecutive MOP commands (708). For example, controller 120 may transmit, to memory device 110, the first maximum number, or less, of ACT commands between consecutive MOP commands that are transmitted to memory device 110. If the controller is in not in a refresh management mitigation mode, flow proceeds to box 711. In box 711, the flow ends. If the controller is in in a refresh management mitigation mode, flow proceeds to box 712 (710). For example, controller 120 may determine whether it is in a mode where it should determine whether to occasionally reconfigure memory device 110 to change the number of levels of victim rows that are refreshed in response to refresh management commands.

Based on a randomized technique meeting a condition, at least a second configuration command is transmitted by the controller to the memory device to configure the memory device to, in response to MOP commands, refresh at least a second number of rows, where the randomized technique is based on the indicator (712). For example, based on a random number value from random number generator 124 meeting a condition (e.g., equal to N, equal to 1, within the range of 2 to N, etc.) that is based on maximum number of ACT commands (e.g., N) that should not be exceeded between consecutive MOP commands, controller 120 may determine whether to reconfigure memory device 110 to refresh a different minimum number (e.g., 3) of levels of victim rows. By the controller and to the memory device, a second MOP command that is to refresh at least the second number of rows is transmitted (714). For example, controller 120 may transmit, to memory device 110, a second MOP command while memory device 110 is configured to refresh at least the second number of levels of victim rows (e.g., 3). In another embodiment, rather than being probabilistically based on a random or pseudo-random number, an algorithmic technique (e.g., every $M^{th}$ set of N activates, every P number of seconds or milliseconds, etc.) may determine whether to reconfigure the number of rows in the memory array that are to be refreshed in response to mitigation operation commands.

The methods, systems and devices described above may be implemented in computer systems, or stored by computer systems. The methods described above may also be stored on a non-transitory computer readable medium. Devices, circuits, and systems described herein may be implemented using computer-aided design tools available in the art, and embodied by computer-readable files containing software descriptions of such circuits. This includes, but is not limited to one or more elements of memory system 100, and its components. These software descriptions may be: behavioral, register transfer, logic component, transistor, and layout geometry-level descriptions. Moreover, the software descriptions may be stored on storage media or communicated by carrier waves.

Data formats in which such descriptions may be implemented include, but are not limited to: formats supporting behavioral languages like C, formats supporting register transfer languages (such as GDSII, GDSIII, GDSIV, CIF, and MEBES), and other suitable formats and languages. Moreover, data transfers of such files on machine-readable media may be done electronically over the diverse media on the Internet or, for example, via email. Note that physical files may be implemented on machine-readable media such as: 4 mm magnetic tape, 8 mm magnetic tape, 3½ inch floppy media, CDs, DVDs, and so on.

Figure 8:
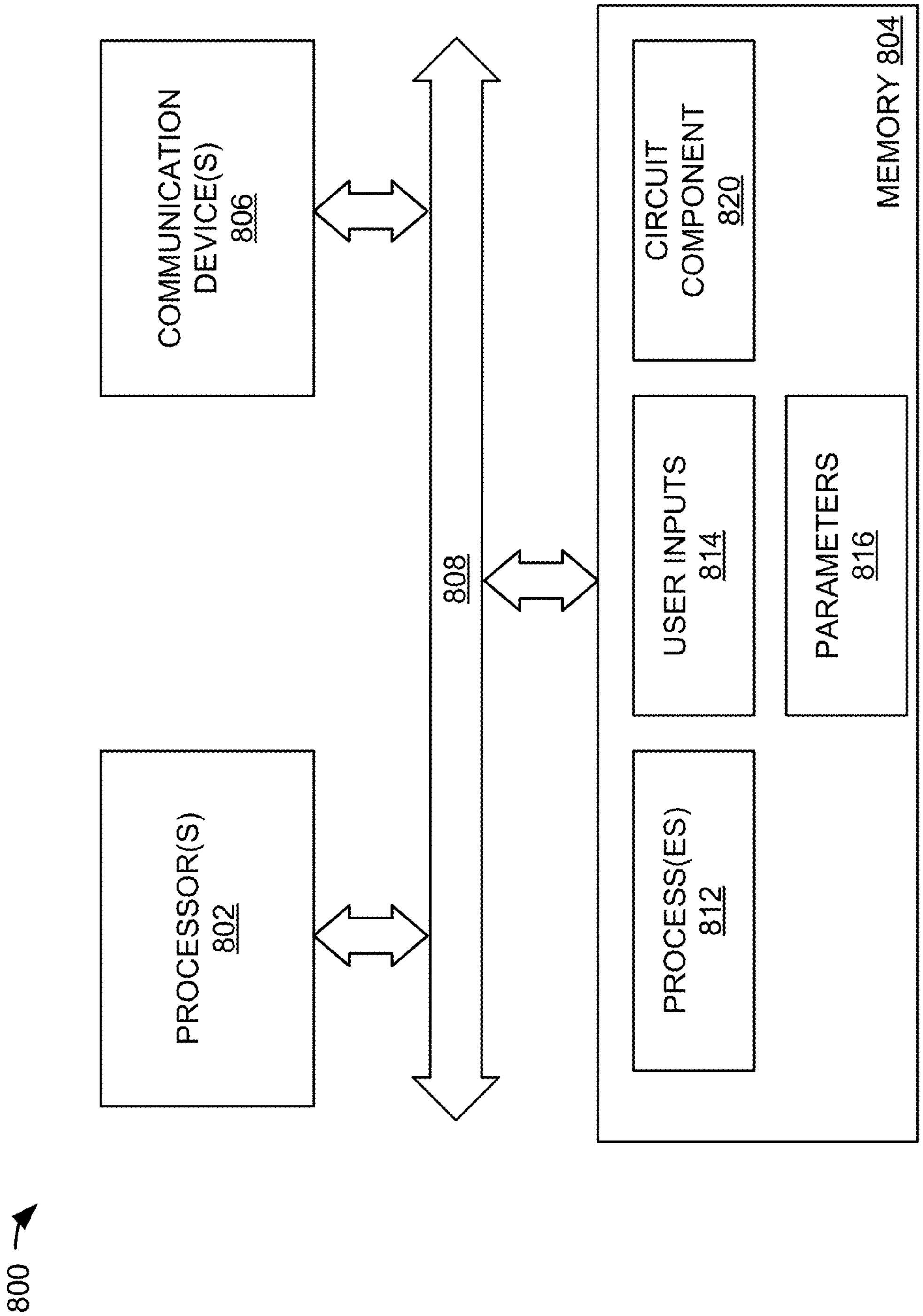
FIG. 8 is a block diagram illustrating a processing system.

FIG. 8 is a block diagram illustrating one embodiment of a processing system 800 for including, processing, or generating, a representation of a circuit component 820. Processing system 800 includes one or more processors 802, a memory 804, and one or more communications devices 806. Processors 802, memory 804, and communications devices 806 communicate using any suitable type, number, and/or configuration of wired and/or wireless connections 808.

Processors 802 execute instructions of one or more processes 812 stored in a memory 804 to process and/or generate circuit component 820 responsive to user inputs 814 and parameters 816. Processes 812 may be any suitable electronic design automation (EDA) tool or portion thereof used to design, simulate, analyze, and/or verify electronic circuitry and/or generate photomasks for electronic circuitry. Representation 820 includes data that describes all or portions of memory system 100 and its components, as shown in the Figures.

Representation 820 may include one or more of behavioral, register transfer, logic component, transistor, and layout geometry-level descriptions. Moreover, representation 820 may be stored on storage media or communicated by carrier waves.

Data formats in which representation 820 may be implemented include, but are not limited to: formats supporting behavioral languages like C, formats supporting register transfer languages (such as GDSII, GDSIII, GDSIV, CIF, and MEBES), and other suitable formats and languages. Moreover, data transfers of such files on machine-readable media may be done electronically over the diverse media on the Internet or, for example, via email User inputs 814 may comprise input parameters from a keyboard, mouse, voice recognition interface, microphone and speakers, graphical display, touch screen, or other type of user interface device. This user interface may be distributed among multiple interface devices. Parameters 816 may include specifications and/or characteristics that are input to help define representation 820. For example, parameters 816 may include information that defines device types (e.g., NFET, PFET, etc.), topology (e.g., block diagrams, circuit descriptions, schematics, etc.), and/or device descriptions (e.g., device properties, device dimensions, power supply voltages, simulation temperatures, simulation models, etc.).

Memory 804 includes any suitable type, number, and/or configuration of non-transitory computer-readable storage media that stores processes 812, user inputs 814, parameters 816, and circuit component 820.

Communications devices 806 include any suitable type, number, and/or configuration of wired and/or wireless devices that transmit information from processing system 800 to another processing or storage system (not shown) and/or receive information from another processing or storage system (not shown). For example, communications devices 806 may transmit circuit component 820 to another system. Communications devices 806 may receive processes 812, user inputs 814, parameters 816, and/or circuit component 820 and cause processes 812, user inputs 814, parameters 816, and/or circuit component 820 to be stored in memory 804.

Implementations discussed herein include, but are not limited to, the following examples:

Example 1: A memory controller, comprising: a command interface to transmit, to a memory device, row activate (ACT) commands, mitigation operation (MOP) commands, and configuration commands; and control circuitry to transmit, based on the memory controller being in a first mode and via the command interface, first configuration commands that change a first number of rows in a memory array of the memory device that are to be refreshed automatically in response to the MOP commands to a second number, the control circuitry to, based on an interval indicator meeting a threshold condition, determine whether to transmit the first configuration commands.

Example 2: The memory controller of example 1, wherein, based on the memory controller being in a second mode, whether to transmit the first configuration commands is not based on the interval indicator meeting the threshold condition.

Example 3: The memory controller of example 1, wherein the control circuitry is to determine whether to transmit the first configuration commands is further based on a randomized selection technique.

Example 4: The memory controller of example 3, wherein a probability of whether to transmit the first configuration commands is based on a refresh interval associated with the memory device.

Example 5: The memory controller of example 3, wherein a probability of whether to transmit the first configuration commands is based on an ACT command count threshold obtained from the memory device.

Example 6: The memory controller of example 3, wherein a probability of whether to transmit the first configuration commands is based on a number of ACT commands that can cause a row hammer error to be introduced into an unrefreshed row in the memory array of the memory device.

Example 7: The memory controller of example 3, wherein a probability of whether to transmit the first configuration commands is based on a duration that a row in the memory array of the memory device spent in an open state.

Example 8: The memory controller of example 1, wherein the second number is based on a number of ACT commands that can cause a row hammer error to be introduced into an unrefreshed row in the memory array of the memory device.

Example 9: The memory controller of example 1, wherein the second number is based on a duration that a row in the memory array of the memory device spent in an open state.

Example 10: A memory controller, comprising: mode circuitry to place the memory controller in at least a first mode and a second mode; circuitry to configure a memory device to, in response to mitigation operation (MOP) commands received from the memory controller, refresh at least a first number of rows in a memory array of the memory device; circuitry to, based on the controller being in the first mode and based on a randomized technique meeting a condition, configure the memory device to, in response to MOP commands received from the memory controller, refresh at least a second number of rows in the memory array of the memory device.

Example 11: The memory controller of example 10, wherein the first number is less than the second number.

Example 12: The memory controller of example 10, wherein, when the memory controller is in the second mode, the memory device is not configured to change a number of rows refreshed in the memory array of the memory device based on the randomized technique meeting the condition.

Example 13: The memory controller of example 10, wherein a probability that the randomized technique meets the condition is based on is based on an indicator of an ACT command count threshold obtained from the memory device.

Example 14: The memory controller of example 10, wherein a probability that the randomized technique meets the condition is based on a number of ACT commands that can cause a row hammer error to be introduced into an unrefreshed row in the memory array of the memory device.

Example 15: The memory controller of example 10, wherein a probability that the randomized technique meets the condition is based on a duration that a row in the memory array of the memory device spent in an open state.

Example 16: A method of operating a memory controller, comprising: configuring a memory device to, in response to mitigation operation (MOP) commands received from the memory controller, refresh at least a first number of rows in a memory array of the memory device; and based on a randomized technique meeting a condition, configuring the memory device to, in response to MOP commands received from the memory controller, refresh at least a second number of rows in the memory array of the memory device.

Example 17: The method of example 16, wherein the first number is less than the second number.

Example 18: The method of example 16, wherein a probability that the randomized technique meets the condition is based on is based on an indicator of an ACT command count threshold obtained from the memory device.

Example 19: The method of example 16, wherein a probability that the randomized technique meets the condition is based on a number of ACT commands that can cause a row hammer error to be introduced into an unrefreshed row in the memory array of the memory device.

Example 20: The method of example 16, wherein a probability that the randomized technique meets the condition is based on a duration that a row in the memory array of the memory device spent in an open state.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A memory controller, comprising:

a command interface to transmit, to a memory device, row activate (ACT) commands, mitigation operation (MOP) commands, and configuration commands; and control circuitry to transmit, based on the memory controller being in a first mode and via the command interface, first configuration commands that change a first number of rows in a memory array of the memory device that are to be refreshed automatically in response to the MOP commands to a second number, the control circuitry to, based on an interval indicator meeting a threshold condition, determine whether to transmit the first configuration commands.

2. The memory controller of claim 1, wherein, based on the memory controller being in a second mode, whether to transmit the first configuration commands is not based on the interval indicator meeting the threshold condition.

3. The memory controller of claim 1, wherein the control circuitry is to determine whether to transmit the first configuration commands is further based on a randomized selection technique.

4. The memory controller of claim 3, wherein a probability of whether to transmit the first configuration commands is based on a refresh interval associated with the memory device.

5. The memory controller of claim 3, wherein a probability of whether to transmit the first configuration commands is based on an ACT command count threshold obtained from the memory device.

6. The memory controller of claim 3, wherein a probability of whether to transmit the first configuration commands is based on a number of ACT commands that can cause a row hammer error to be introduced into an unrefreshed row in the memory array of the memory device.

7. The memory controller of claim 3, wherein a probability of whether to transmit the first configuration commands is based on a duration that a row in the memory array of the memory device spent in an open state.

8. The memory controller of claim 1, wherein the second number is based on a number of ACT commands that can cause a row hammer error to be introduced into an unrefreshed row in the memory array of the memory device.

9. The memory controller of claim 1, wherein the second number is based on a duration that a row in the memory array of the memory device spent in an open state.

10. A memory controller, comprising:

mode circuitry to place the memory controller in at least a first mode and a second mode;

circuitry to configure a memory device to, in response to mitigation operation (MOP) commands received from the memory controller, refresh at least a first number of rows in a memory array of the memory device;

circuitry to, based on the controller being in the first mode and based on a randomized technique meeting a condition, configure the memory device to, in response to MOP commands received from the memory controller, refresh at least a second number of rows in the memory array of the memory device.

11. The memory controller of claim 10, wherein the first number is less than the second number.

12. The memory controller of claim 10, wherein, when the memory controller is in the second mode, the memory device is not configured to change a number of rows refreshed in the memory array of the memory device based on the randomized technique meeting the condition.

13. The memory controller of claim 10, wherein a probability that the randomized technique meets the condition is based on an indicator of an ACT command count threshold obtained from the memory device.

14. The memory controller of claim 10, wherein a probability that the randomized technique meets the condition is based on a number of ACT commands that can cause a row hammer error to be introduced into an unrefreshed row in the memory array of the memory device.

15. The memory controller of claim 10, wherein a probability that the randomized technique meets the condition is based on a duration that a row in the memory array of the memory device spent in an open state.

16. A method of operating a memory controller, comprising:

configuring a memory device to, in response to mitigation operation (MOP) commands received from the memory controller, refresh at least a first number of rows in a memory array of the memory device; and based on a randomized technique meeting a condition, configuring the memory device to, in response to MOP commands received from the memory controller, refresh at least a second number of rows in the memory array of the memory device.

17. The method of claim 16, wherein the first number is less than the second number.

18. The method of claim 16, wherein a probability that the randomized technique meets the condition is based on an indicator of an ACT command count threshold obtained from the memory device.

19. The method of claim 16, wherein a probability that the randomized technique meets the condition is based on a number of ACT commands that can cause a row hammer error to be introduced into an unrefreshed row in the memory array of the memory device.

20. The method of claim 16, wherein a probability that the randomized technique meets the condition is based on a duration that a row in the memory array of the memory device spent in an open state.

* * * * *